United States Patent [19]
Gaudenzi et al.

[11] Patent Number: 5,490,040
[45] Date of Patent: Feb. 6, 1996

[54] SURFACE MOUNT CHIP PACKAGE HAVING AN ARRAY OF SOLDER BALL CONTACTS ARRANGED IN A CIRCLE AND CONDUCTIVE PIN CONTACTS ARRANGED OUTSIDE THE CIRCULAR ARRAY

[75] Inventors: Gene J. Gaudenzi, Purdys, N.Y.; Joseph M. Mosley; Vito J. Tuozzolo, both of Boca Raton, Fla.; John C. Milliken, Patterson, N.Y.

[73] Assignee: International Business Machines Corporation, Armonk, N.Y.

[21] Appl. No.: 172,467

[22] Filed: Dec. 22, 1993

[51] Int. Cl.⁶ .............................. H01R 9/09; H01L 23/48; B23K 31/02
[52] U.S. Cl. .......................... 361/773; 361/760; 361/772; 361/776; 361/779; 361/783; 174/260; 228/180.21; 228/180.22; 257/697; 257/738; 257/779; 257/786
[58] Field of Search ............................... 228/179.1, 180.1, 228/180.21, 180.22, 175.1; 257/692, 693, 697, 698, 700, 723, 724, 728, 738, 773, 786, 690, 653, 696, 737, 734, 747, 778, 779, 650, 652, 656; 361/760, 767, 770, 772, 773, 774, 777, 807, 808, 809, 776, 783, 784, 820; 437/204, 209, 183; 439/68, 69, 74, 75, 76, 78, 83, 84, 72, 65, 72; 174/52.1, 260

[56] References Cited

U.S. PATENT DOCUMENTS

| 3,795,845 | 3/1974 | Cass et al. | 257/786 |
| 3,871,014 | 3/1975 | King et al. | 257/778 |

(List continued on next page.)

FOREIGN PATENT DOCUMENTS

| 3129568 | 4/1982 | Germany | 257/779 |
| 58-53837 | 3/1983 | Japan | 257/786 |
| 60-57957 | 4/1985 | Japan | 257/697 |
| 62-243347 | 10/1987 | Japan | 257/693 |
| 1-24434 | 1/1989 | Japan | 228/180.22 |
| 1-112742 | 5/1989 | Japan | 257/737 |
| 1-230264 | 9/1989 | Japan | 257/697 |

(List continued on next page.)

OTHER PUBLICATIONS

IBM Disclosure Bulletin "Chip Mounting With Prestretched Joints" by V. D. Coombs vol. 16 No. 3 Aug. 1973 (p. 767).
IBM Disclosure Bulletin "Method of Preparation of Controlled Chip Joining" by Bakos et al. vol. 21 No. 9 Feb. 1979 (p. 3593).
IBM Disclosure Bulletin "Pluggable–Module Power–Connection Mechanism" vol. 27 No. 10A Mar. 1985 (pp. 5599 and 5600).
IBM Disclosure Bulletin "Area Array Substrate–to–Carrier Interconnection Using Corner Standoff" vol. 29 No. 11 Apr. 1987 (pp. 4736 and 4737).
IBM Disclosure Bulletin "Module Interconnection Using Hybrid Attachment" vol. 35 No. 7 Dec. 1992 (pp. 330 and 331).
IBM Disclosure Bulletin "Module Connection" vol. 37 No. 01 Jan. 1994 (pp. 595 and 596).
IBM Disclosure Bulletin "Solder Ball Connect Design with improved Reliability" vol. 37 No. 04B Apr. 1994 (pp. 137–140).

*Primary Examiner*—Donald A. Sparks
*Attorney, Agent, or Firm*—Bernard D. Bogdon

[57] ABSTRACT

An electrical device for logic circuits having a package comprising a combination of controlled collapse electrical interconnections, such as solder balls and pin through-hole conductors, wherein the conductors are disposed outside the perimeter of an inter-array of solder balls, which when a maximum number of solder balls are disposed, the array is circular in shape, so as to provide an increased footprint for the electrical device beyond that, otherwise maximum footprint for solder balls alone, which footprint is otherwise limited in size due to failures which occur in solder balls when solder balls are exposed to thermal and mechanical stress levels at extended distances from the neutral or zero stress point of the array.

1 Claim, 3 Drawing Sheets

U.S. PATENT DOCUMENTS

| | | | |
|---|---|---|---|
| 3,871,015 | 3/1975 | Lin et al. | 257/778 |
| 4,067,104 | 1/1978 | Tracy | 228/180.22 |
| 4,581,680 | 4/1986 | Garner | 361/772 |
| 4,604,644 | 8/1986 | Beckham et al. | 257/737 |
| 4,724,472 | 2/1988 | Sugimoto et al. | 257/778 |
| 4,878,611 | 11/1989 | LoVasco et al. | 228/180.22 |
| 5,186,383 | 2/1993 | Melton et al. | 228/180.22 |
| 5,269,453 | 12/1993 | Melton et al. | 228/180.22 |
| 5,394,009 | 2/1995 | Loo | 257/734 |

FOREIGN PATENT DOCUMENTS

| | | | |
|---|---|---|---|
| 2-109358 | 4/1990 | Japan | 257/779 |
| 3-104149 | 5/1991 | Japan | 257/697 |
| 3-148165 | 6/1991 | Japan | 257/697 |
| 3-205859 | 9/1991 | Japan | 257/697 |
| 4-142766 | 5/1992 | Japan | 257/697 |
| 5-67647 | 3/1993 | Japan | 228/179.1 |
| 5-183247 | 7/1993 | Japan | 439/68 |

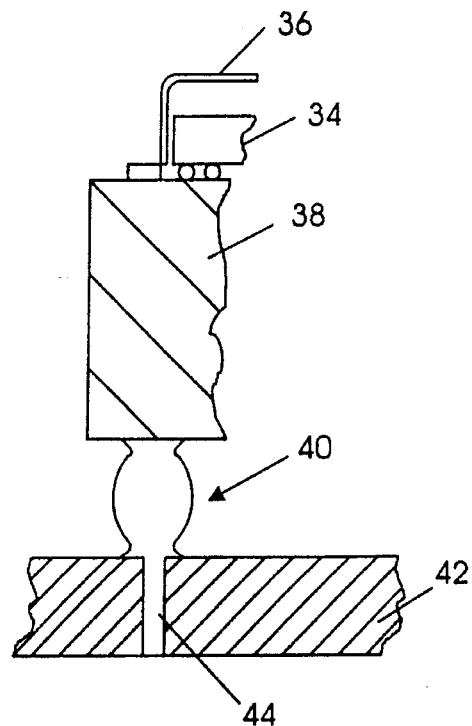
FIG. 4
PRIOR ART
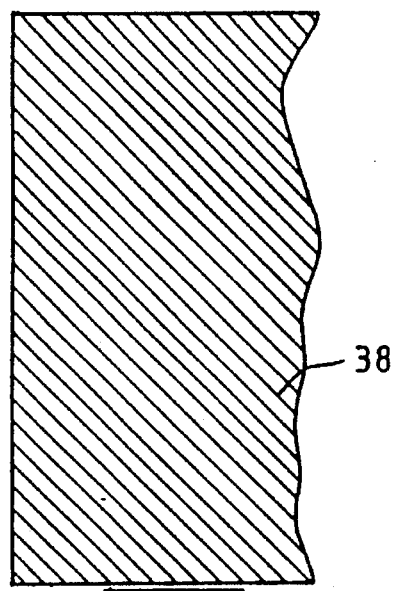
FIG. 5
PRIOR ART
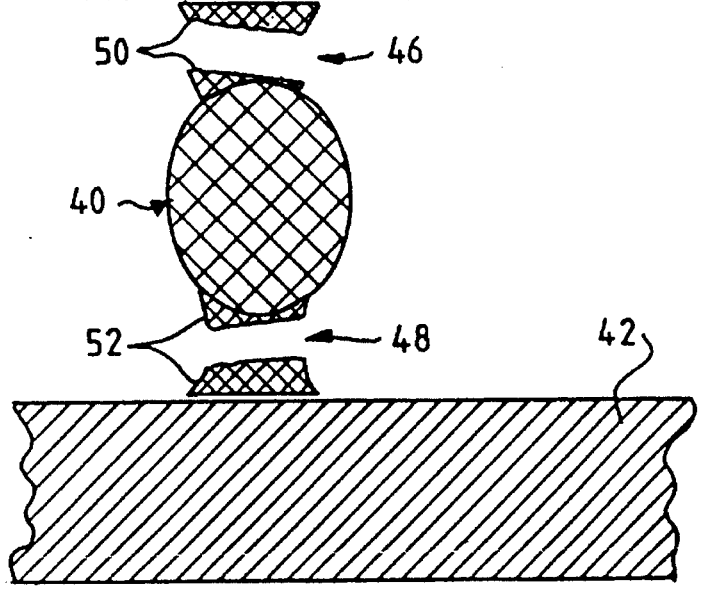

SURFACE MOUNT CHIP PACKAGE HAVING AN ARRAY OF SOLDER BALL CONTACTS ARRANGED IN A CIRCLE AND CONDUCTIVE PIN CONTACTS ARRANGED OUTSIDE THE CIRCULAR ARRAY

BACKGROUND OF THE INVENTION

1. Field of the Invention

The present invention relates to microminiature electronic circuitry surface mount technology (SMT) and particular to packaging integrated circuit devices including chips and modules utilizing a combination of controlled collapse electrical interconnections, such as solder balls, and pin through-hole conductors.

2. Description of Related Art

Solder electrical contacts, particularly for integrated circuits and VLSI technology (very large scale integration), has been widely used and implemented for more than two decades. As it has been perfected, it has made extensive use of what is known as solder ball connection (SBC) technology. Numerous techniques have been developed, such as the controlled chip collapse connection or C-4 technology within the IBM Corporation which has often been referred to in the industry as the flip-chip technique. The term flip-chip is used because it employed packaging chips, for example, with their electrical connections facing down as opposed to a previous extensively used technique of making electrical connections by, for example, wire bond techniques to package (e.g. chip) pins which are pointed upward, in what might be referred to as an inverted package.

Extensive studies have shown that solder ball connection (SBC) arrays, although highly reliable, have certain dimensional and distance limitations which are a factor of the maximum distance that a solder ball can be located from what is usually referred to as a neutral point or point of zero stress on an area array for a chip without threat of rupture or stress fracture. Such chips usually have a footprint which comprises an array of uniformly spaced solder balls in a substantially rectangular and preferably symmetrical square pattern or layout.

Most any connecting system for electrically joining microminiature devices with system components typically has a mismatch of materials between, for example, a chip, a module and/or a circuit board, which mismatch produces mechanical stress in the electrical connection joints. The differences in the coefficients of thermal expansion between the material, for example, silicon of the circuit chip, the material, for example, ceramic used for the module substrate and the epoxy/glass circuit card to which the module mounts, through the use of the solder balls, are significant. Those mechanical stresses including those stresses generated by shock which can occur merely from a device being dropped, have been widely studied and it is generally recognized that there are limitations as to the maximum number of solder balls, as a factor of their size in combination with their spacing, which can be incorporated so as to have satisfactory reliability and continued continuity for the established electrical connections.

Other factors which affect the configuration and the quantity of the incorporated solder balls involves the materials that are used in making either the solder balls and the material which with the solder ball mates or connects on either the chip or the module.

Another utilized technique to increase the reliability of the neutral point distance is to epoxy the chip or module to the board. As the chip or module stresses due to heat expansion the stress is transferred or dissipated through the epoxy or glue to the board or card. This is an expansive technique which does not provide for rework of the card if there is component failure.

SUMMARY OF THE INVENTION

The present inventive contribution presents a technique wherein the chip package and the location of it's input/output (I/O) terminals and their quantity and the corresponding device footprint can be increased. The technique provides for extending the solder ball connection technology to higher density I/O footprints which scheme yields a higher I/O count, while at the same time capitalizing upon the advantage of the inherently low inductance of the solder ball connection package.

This advantage is accomplished by the I/O count on the component package being increased by adding electrical conducting pins to I/O locations extending more outwardly from the solder ball connectors. Conducting pins have good mechanical and electrical characteristics similar to wire but have an order of magnitude greater inductance then solder balls. The pins are located more outwardly from the calculated point of zero stress of the component than the solder balls and generally beyond that dimension which has been identified as the distance from the point of zero stress where stress fractures in solder balls is not likely to occur. When the maximum number of solder balls are disposed in this manner, the solder balls form a circular array. The strength and flexibility of the electrical connecting pins, particularly for pins which have been brazed, and which are intended for through-hole connection, can more readily withstand undue stresses which are experienced due to thermal expansion and can do so at greater distances from the point of zero stress.

This inventive technique provides for efficiency and the maximum utilization of all potential electrical connections and eliminates any need to provide so called sacrificial solder balls or other stress carriers which are not functionally electrically operational. It is well appreciated that, for example, a connection grid array of 10 by 10 is not as reliable as a grid area of 10 by 10 contained with a box of 12 by 12 where the extra two rows are pins. With the present invention, the extra two rows can be electrically functional and yet highly reliable from a stress fracture stand-point.

BRIEF DESCRIPTION OF THE DRAWINGS

FIG. 4 is a partial sectional view of a typical solder ball module assembly, illustrating solder ball connection techniques for connection to a circuit board at a via hole, without the benefit of the principles of the present invention;

FIG. 5 is a exemplary exploded view of the solder ball of FIG. 3 and FIG. 4 illustrating fractures in the solder ball connection;

DESCRIPTION OF THE ILLUSTRATIVE EMBODIMENTS

The present invention will be described more fully hereinafter with reference to the accompanied drawings, in which illustrative embodiments of the present invention are shown. It is to be understood at the outset of the description which follows that persons of skill in the appropriate arts may modify the invention herein described while still achieving the favorable results of this invention. Accordingly the description which follows is to be understood as being a broad, teaching disclosure directed to persons of skill in the appropriate arts, and not as limiting upon the present invention.

Figure 1:
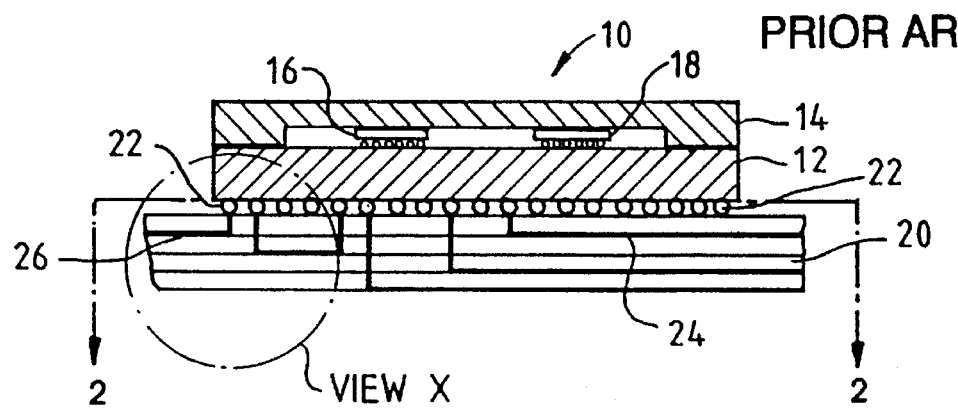
FIG. 1 is a cross sectional view of an electronic component module, utilizing solder ball connection technology, without the benefit of the principles of the present invention.

Illustrated in FIG. 1 is a module 10 having a substrate base 12 and a cap 14. Sandwiched between the cap 14 and the base 12 are illustrated exemplary chips 16 and 18. Module 10 is connected to an epoxy glass circuit board card 20. Electrical conductivity between the card 20 and the chip 16 and 18 is maintained by the electrically conductive material, exemplary illustrated as solder balls 22. Hard-wire lines or printed circuit board electrical paths are typically shown and illustrated as lines 24 and 26.

The illustration in FIG. 1 is shown in cross section and the module cap 14 is typically a material comprising a solderable cap or brazed ceramic. A glob-top can also be employed. Also a thermal conduction module (TCM) cap can be considered, albeit more expensive. The base or substrate 12 is typically a ceramic material and can be composed of such materials as keyathera or material referred to as "92-11". The card 20, as previously stated, is a composition of epoxy/glass or such other suitable materials such as copper-invar-copper (cu-inv-cu).

Figure 2:
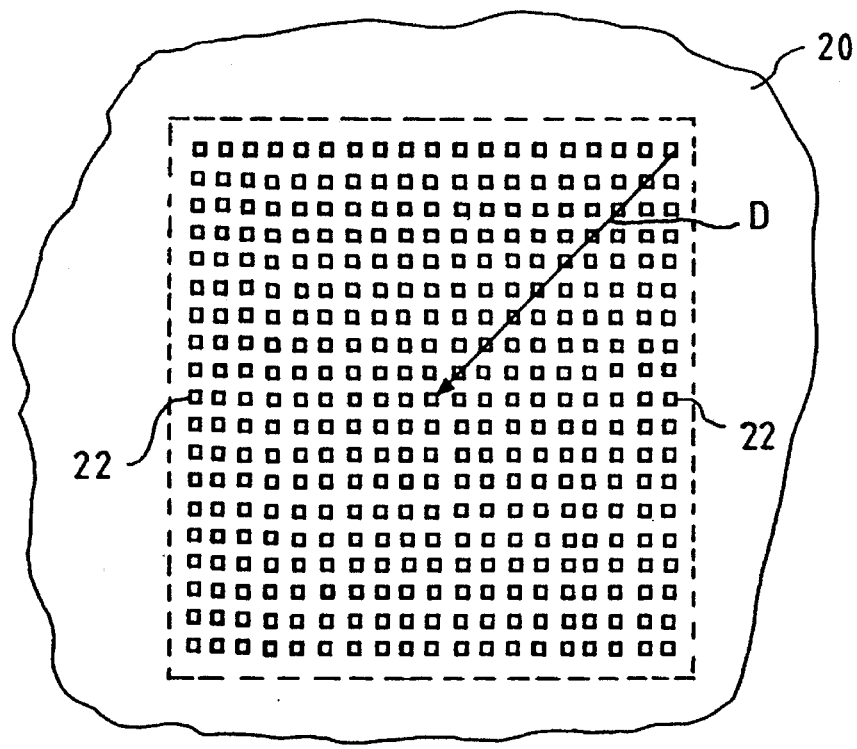
FIG. 2 is a sectional view along the plane A—A' of FIG. 1 showing an area array chip with a matrix of solder balls, without the benefit of the principles of the present invention.

FIG. 2 is a view along section lines A—A of FIG. 1 and shows the footprint of a typical array of electrically conductive materials 22. This array is an arrangement of uniformly spaced (e.g. grids of 50 mil or 100 mil) and in-line electrical contacts or stations and rows. This illustration can be varied without disrupting the integrity of the array. These arrays without the benefit of the present invention have a limit in overall size of approximately 50 mm in size due to temperature change induced cracks or stress. The footprint of each solder ball immediately adjacent to the underside surface of the substrate 12 is illustrated generally in a square configuration. That square configuration is approximated and will be better appreciated when viewed in FIG. 3 which is an exploded view of View X of FIG. 1 of the left most positioned solder ball 22.

Figure 3:
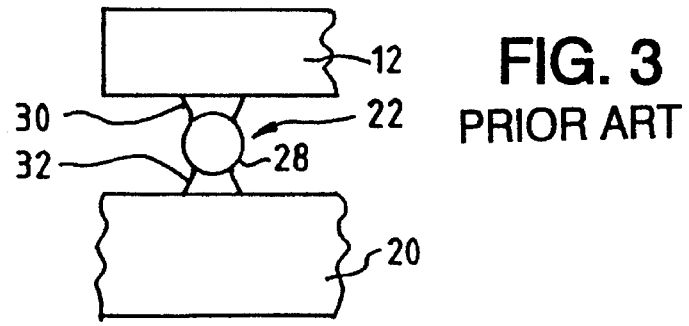
FIG. 3 is an exemplary exploded view of a single solder ball within View X of FIG. 1.

The solder ball is composed of a central portion which is a generally spherically shaped ball 28 and can be composed of a solder material known as 90/10 wherein 90% of the material is lead (PB) and 10% of the material is tin (Sn). An upper foot 30 of the solder ball 22 provides for contact between the spherical ball 28 and the electrical connecting terminal disposed on the underside of the substrate 12. Whereas a lower foot 32 provides for electrical connection between the spherical ball 28 of the solder ball 22 and the epoxy glass card 20 and the electrical terminal disposed thereon for providing continuous electrical continuity. The upper foot 30 and a lower foot 32 can be comprised of materials, such as 37/63 PB/Sn. The lead-tin composition selections are selected primarily for reasons related to manufacturability and of course electrical conductivity. During original manufacturing or later rework, as for example, the solder ball is not melted but the upper and lower feet may be fused in place or removed by melting, and is accomplished due to the differing lead-tin content. This construction, as illustrated in FIGS. 1, 2, and 3 is reasonably typical to devices which are readily used in the present state of the art and does not incorporate the features of the present invention.

Figure 8:
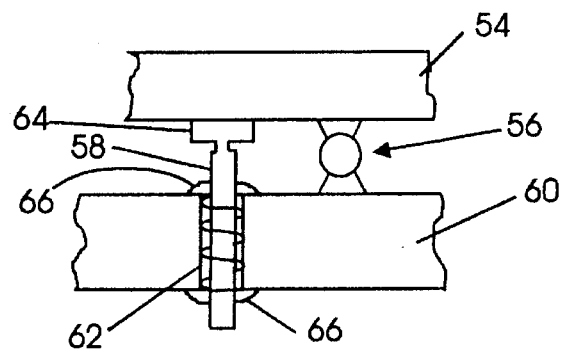
FIG. 8 is an exemplary exploded view, within View Y of FIG. 6, illustrating an electrical pin and a solder ball in electrical contact with a exemplary circuit board, according to the principles of the present invention.

Such a typical state of the art device is illustrated in FIG. 4 where shown in partial cross section is an exemplary chip 34 disposed within a partially illustrated cap 36, which cap is secured to a substrate 38 in typical fashion. Electrical circuitry is provided for connection between the appropriate terminals of the chip 34 and the solder ball 40 which in turn provides the electrical circuit between the substrate 38 and the card 42 and makes electrical contact with a typically illustrated via 44 within the card 42. These vias are smaller in diameter than plated-through holes (PTH) for pin connectors, such as shown in FIG. 8. These vias facilitate expeditious reworking.

Under thermal stress conditions, where a solder ball is subjected to an undue influence of material differences and thermal coefficients of expansion from the various components, including the module cap 14, the module substrate 12 and the circuit card 20, as for example, stress fractures can be generated such as these exhibited in the exploded view of FIG. 5. Failure from fatigue caused by thermal cycles (e.g. by repeatedly turning the end assembly on and off) is created by the thermal conditions and can result in fractures, such as those illustrated in cross section at areas 46 and 48. This stress is caused by the expansion of a module which may, for example, be at ambient temperature, which is then operated and, which as a consequence, shortly afterwards reaches a relatively high temperature, such as 80 to 100 degrees centigrade. These stress fractures are usually shear stress fractures and are illustrated as occurring in the upper foot 50 and the lower foot 52 of the typically illustrated solder ball 40.

Figure 6:
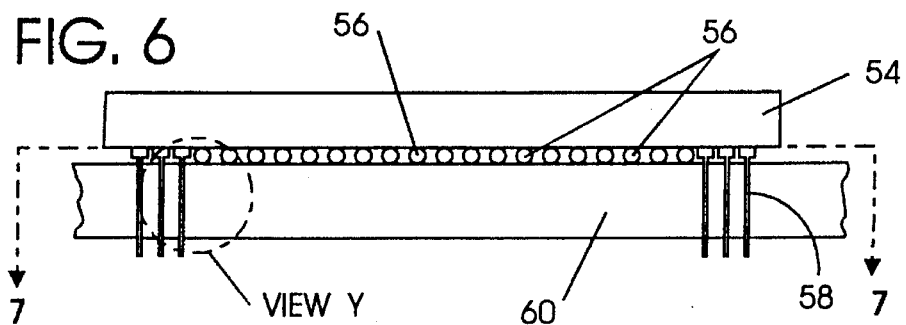
FIG. 6 is a cross sectional view of a packaged electrical component having solder balls and electrical pins according to the principles of the present invention.
Figure 7:
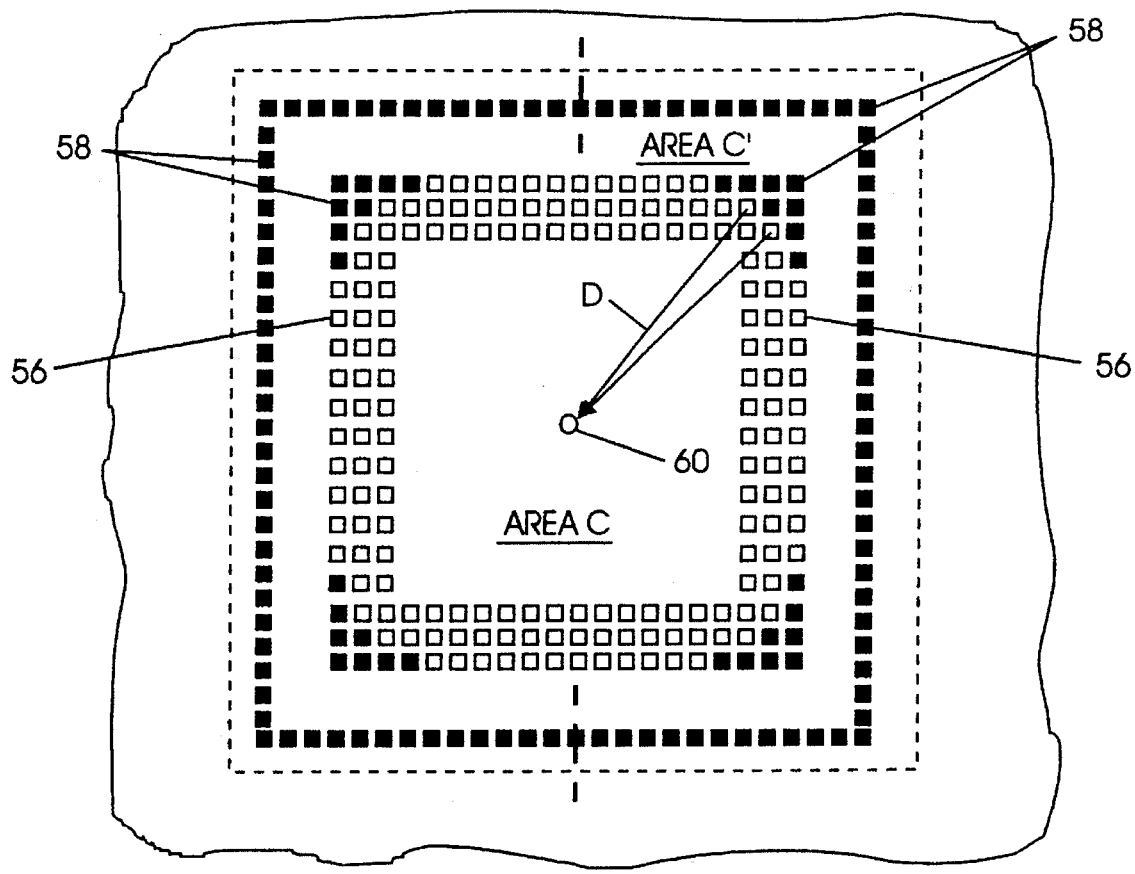
FIG. 7 is a sectional view along the plane B—B' of FIG. 6 illustrating the footprint pattern of the electrical pins and solder balls according to the principles of the present invention.

FIGS. 6, 7, and 8 are illustrations of modules incorporating features according to the principles of the present invention. In FIG. 6 illustrated in typical fashion is a substrate 44, as illustrated with a substantially planar base, providing for electrical conductivity there through, to pass to typically illustrated solder balls 46 and the electrically conductive pins 48 disposed outwardly from the central portion of the module and outside of the solder balls 46. The pins 58 can be of differing materials, including, for example, gold-plated steel Kovour. Other eutectic materials can be employed. These types of pins provide a relatively high degree of reliability but are also, when compared to solder balls, relatively expensive. Both the solder balls 56 and the pins 58 provide for electrical conductivity between the module of the substrate 54 to the circuit card 60.

A typical array of the solder balls 56 and the pins 58 is as best illustrated in FIG. 7. FIG. 6 is the cross sectional view as presented along the lines B—B of FIG. 7. This array, generally speaking, can easily approach 64 mm in size. The size parameters are dependent upon such factors as the type of socket the pins are connected to. In the illustration of FIG. 7 the total I/Os have increased from 329 to 625 when on a grid of 0.050 inch centers. In FIG. 7 the footprints of each of the electrical connections including the solder balls 56 and the electrical pins 58 are shown generally in geometric configuration as a square. Those squares, which are illustrated as outlines and are open in the center and which are identified generally by reference character 56, are solder balls. Those squares, which are darkened boxes or squares and which are typically identified by 58, are pins. It will be noted generally that the solder balls extend no further out from the identified neutral point than that dimension which is the maximum allowable dimension or distance from the neutral point. The illustrated distance "D" is, in this typical illustration, the maximum distance the solder balls should extend from the neutral point 60 so as to prevent stress fractures. It is clear that even one connector pin placed outside of the solder ball array will provide an advantage to preclude stress fractures in the solder balls, but in practice more pins, such as a single row surrounding the solder ball array, are preferred.

Under certain circumstances this "D" dimension is approximately 13.5 mm. In the illustrated geometrically symmetrical laid out array of FIG. 7, point 60 is at the center of what in this illustration could comprise a circle of solder balls having a radius of "D" with the circles center at point 60. It is fully appreciated that in every instance the arrangements need not necessarily be symmetrically disposed about a central most point. However, that is the preferred case and for the convenience of this particular discussion, the symmetrical illustration is presented. In FIG. 7 the center area identified as Area C is typically comprised of solder balls uniformly spaced and disposed and are of solder balls of the kind as illustrated in FIG. 6 as solder ball 56. Electrically conductive materials, which extend beyond the maximum desirable dimension D, as measured from the central or neutral point 60, are illustrated as electrical pins 58. Typically any electrical contact or conductive materials within Area C are of the kind of electrical pins as illustrated by pins 58.

Studies have resulted in the following satisfactory results for the mentioned module sizes: where the I/Os are on 0.050" centers:

Module of 25 mm—I/O count increased form 329 to 361;

Module of 32 mm—I/O count increased from 329 to 625; and

Module of 44 mm—I/O count increased from 329 to 1,089.

This inventive combination has at least the following advantages: The inclusion of both pins and solder balls as I/Os on the same platform (e.g. large MLC substrates) increases the I/O density; pin locations may be on 50 or 100 mil grid; pins used for low inductance ports do not require gold plate; concerns of aligning the solder balls to the next level of assembly are significantly reduced due to the fact that the pins will guide (self-align) the substrate into the next level of assembly; the self-alignment feature minimizes the added equipment expense and process step of optical alignment required if only solder balls are present; the solder ball acts as a built in standoff, thus eliminating the requirement for special forming of the pin or addition of a standoff post; and pins "protect" the SBC solder balls during handling before assembly.

By limiting pins to those areas generally outside of the critical dimension "D", the relative cost of the packaged component can be controlled. This combination of, for example, solder balls and pins provides for a bigger footprint for the component package but not at significantly increased costs nor any sacrifice in reliability or performance. This marriage of SBC and pin-in-hole technology has been quite successful.

FIG. 8, which is an exploded view of View Y in FIG. 6, best illustrates a typical solder ball 56 and the typical pin 58. In the illustration of FIG. 8 a plated-through-hole (PTH) 62 or socket, in the card 60 is provided into which the pin 58 is inserted. The pin 58 is brazed at location 64. The arrangement also facilitates the alignment of the substrate 54 with the card 60. The PTH is typically copper-clad and the pin is usually then soldered in place with, for example, 37/63 solder shown at locations 66. It is readily apparent that pins can be incorporated with other solder techniques such as solder columns. Further when pins are used in combination with materials like solder balls, the pins do not have to be swedged to prevent over insertion. The solder balls act as a natural stop and selected pins with built in stops do not need to be specially formed and located to accomplish stand off between the component package and its connected circuitry.

While the invention is particularly shown and described with reference to a detailed description, it would be understood by those skilled in the art that various changes in form and detail may be made therein without departing from the spirit and scope of the invention.

What is claimed is:

1. A packaged electronic hardware unit having a footprint including an array of electrical connections for engagement with a circuit board for performing logic functions without incurring mechanical stress which can result in electrical discontinuity at the electrical connections, comprising:

a substrate having a center and a planar underside surface;

an electrical logic circuit have input/output terminals carried by the substrate;

individual contacts of controlled collapse electrically conductive solder material connected to some of the input/output terminals formed in the shape of balls extending downwardly from the substrate and extending in an orthogonal direction from the planar underside surface of the substrate; and individual pins of electrically conductive material connected to other of the input/output terminals not connected to the contacts, extending downwardly from the substrate and orthogonally from the substantially planar underside surface of the substrate and disposed more outwardly from the center of the substrate than any contact to form an array of electrical connections including contacts and pins, which contacts include a maximum number of contacts forming a circular array of contacts, and which pins are disposed farther from the center of the substrate than the contacts to provide electrical connections which do not incur mechanical stress which can result in electrical discontinuity at the electrical connections.

\* \* \* \* \*